(12) United States Patent
Huang et al.

(10) Patent No.: US 12,527,117 B2
(45) Date of Patent: Jan. 13, 2026

(54) MANUFACTURING METHOD OF ELECTRONIC DEVICE

(71) Applicant: InnoLux Corporation, Miao-Li County (TW)

(72) Inventors: Wan-Ling Huang, Miao-Li County (TW); Chun-Hsien Lin, Miao-Li County (TW); Yi-An Chen, Miao-Li County (TW); Tsau-Hua Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 604 days.

(21) Appl. No.: 17/943,193

(22) Filed: Sep. 12, 2022

(65) Prior Publication Data

US 2023/0109954 A1  Apr. 13, 2023

(30) Foreign Application Priority Data

Oct. 8, 2021 (CN) .......................... 202111171157.7

(51) Int. Cl.
| | |
|---|---|
| *H10H 29/01* | (2025.01) |
| *H10H 20/01* | (2025.01) |
| *H10H 29/02* | (2025.01) |
| *H10H 29/45* | (2025.01) |
| *H10H 29/49* | (2025.01) |

(52) U.S. Cl.
CPC .......... *H10H 20/01* (2025.01); *H10H 29/012* (2025.01); *H10H 29/02* (2025.01); *H10H 29/036* (2025.01); *H10H 29/0361* (2025.01); *H10H 29/0362* (2025.01); *H10H 29/0364* (2025.01); *H10H 29/45* (2025.01); *H10H 29/49* (2025.01); *H10H 20/0362* (2025.01); *H10H 20/0363* (2025.01); *H10H 20/0364* (2025.01)

(58) Field of Classification Search
CPC .......................... H01L 25/0753; H01L 25/167
See application file for complete search history.

(56) References Cited

U.S. PATENT DOCUMENTS

| | | | |
|---|---|---|---|
| 2020/0203235 A1 | 6/2020 | Jung | |
| 2022/0123188 A1* | 4/2022 | Chen | ...................... H10D 86/60 |

FOREIGN PATENT DOCUMENTS

| | | | | |
|---|---|---|---|---|
| CN | 109285845 A | * | 1/2019 | ............ H10D 86/60 |
| CN | 109962095 A | | 7/2019 | |
| CN | 110325005 A | | 10/2019 | |
| CN | 112447118 A | | 3/2021 | |
| TW | 202121380 A | | 11/2019 | |

* cited by examiner

*Primary Examiner* — Zandra V Smith
*Assistant Examiner* — Molly K Reida
(74) *Attorney, Agent, or Firm* — Winston Hsu

(57) ABSTRACT

A manufacturing method includes providing a first substrate including a circuit layer and an electronic element disposed on the circuit layer, providing a second substrate, bonding the first substrate and the second substrate to form an electronic module, cutting the electronic module, forming a wire on a first surface exposed after cutting the electronic module and on a second surface of the electronic module, wherein the first surface is adjacent to the second surface and the wire is electrically connected to the circuit layer, and disposing a driving element on the second surface of the electronic module to be electrically connected to the wire.

8 Claims, 12 Drawing Sheets

MANUFACTURING METHOD OF ELECTRONIC DEVICE

BACKGROUND OF THE DISCLOSURE

1. Field of the Disclosure

The present disclosure relates to a manufacturing method of an electronic device, and more particularly to a manufacturing method of an electronic device applied to a tiled electronic device.

2. Description of the Prior Art

Current electronic devices are developed into narrow bezel electronic devices or electronic devices without bezel, which can be tiled to form large-sized electronic devices. Therefore, to improve the manufacturing process of the narrow bezel electronic devices or electronic devices without bezel is the direction of development in the present field.

SUMMARY OF THE DISCLOSURE

In some embodiments, a manufacturing method of an electronic device is provided by the present disclosure. The manufacturing method includes providing a first substrate and a second substrate, wherein the first substrate includes a circuit layer and an electronic element disposed on the circuit layer. The manufacturing method further includes bonding the first substrate and the second substrate to form an electronic module, cutting the electronic module, and forming a wire on a first surface exposed after the electronic module is cut and on a second surface of the electronic module, wherein the first surface is adjacent to the second surface, and the wire is electrically connected to the circuit layer. The manufacturing method further includes disposing a driving element on the second surface of the electronic module to be electrically connected to the wire.

In some embodiments, a manufacturing method of an electronic device is provided by the present disclosure. The manufacturing method includes providing a first substrate, wherein the first substrate includes a circuit layer. The manufacturing method further includes cutting the first substrate, and forming a wire on a first surface exposed after the first substrate is cut and on a second surface of the first substrate, wherein the first surface is adjacent to the second surface, and the wire is electrically connected to the circuit layer. The manufacturing method further includes disposing an electronic element on the circuit layer, bonding the first substrate after cutting and a second substrate to form an electronic module, and disposing a driving element on the second surface of the first substrate to be electrically connected to the wire.

These and other objectives of the present disclosure will no doubt become obvious to those of ordinary skill in the art after reading the following detailed description of the embodiment that is illustrated in the various figures and drawings.

DETAILED DESCRIPTION

Figure 1:
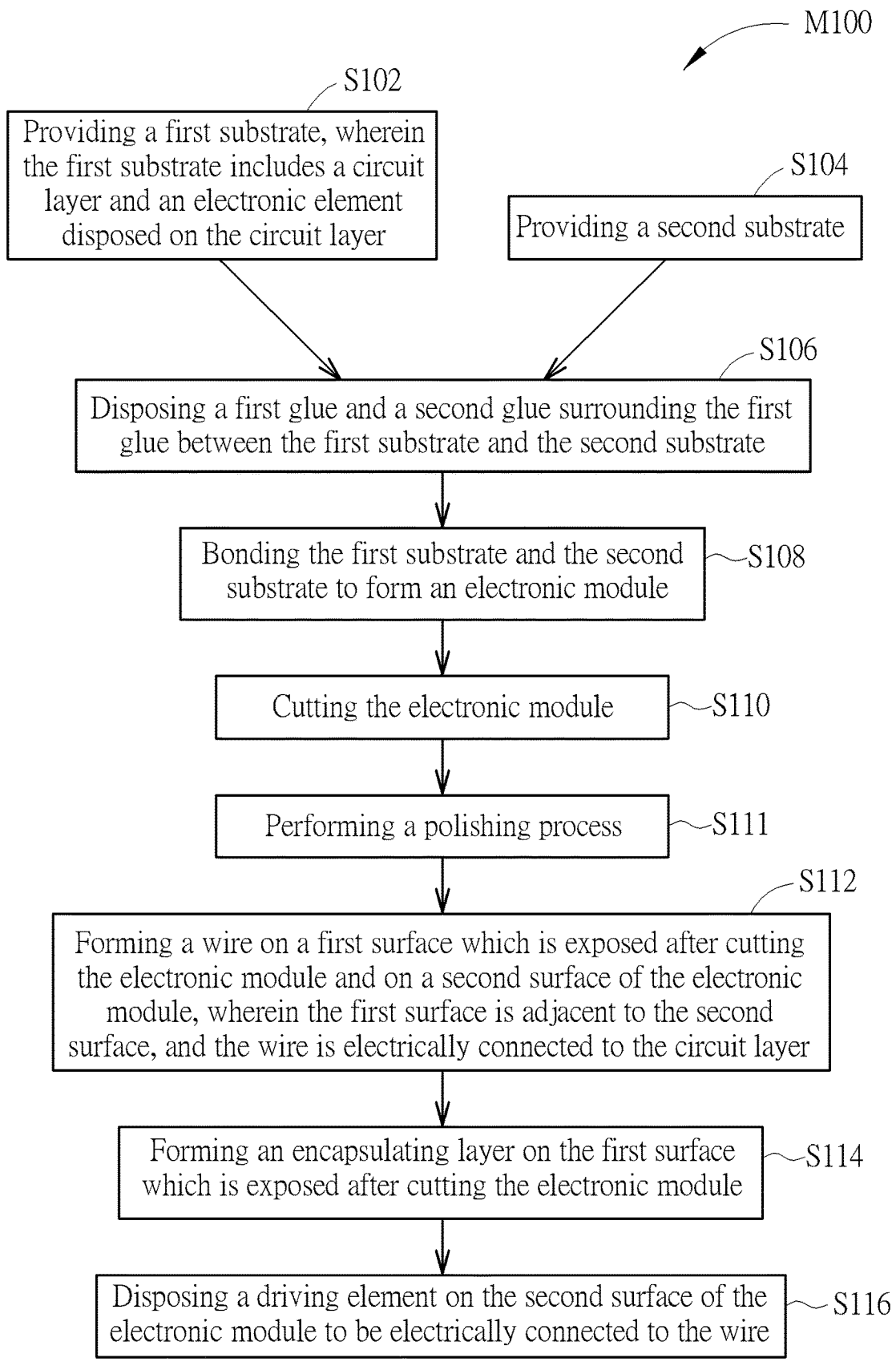
FIG. 1 is a flow chart of a manufacturing method of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or : layers may be presented (indirectly). In contrast, when an element is referred to as being "directly on" or "directly connected to" another element or layer, there are no intervening elements or layers presented. When an element or a layer is referred to as being "electrically connected" to another element or layer, it can be a direct electrical connection or an indirect electrical connection.

The terms "approximately", "equal to", "equal" or "same", "substantially" or "approximately" are generally interpreted as being within +20% of the given value, or interpreted as being within +10%, +5%, +3%, +2%, +1%, or +0.5% of the given value.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

The electrical connection or coupling described in the present disclosure may refer to a direct connection or an indirect connection. In the case of a direct connection, the ends of the elements on two circuits are directly connected or connected to each other by a conductor segment. In the case of an indirect connection, switches, diodes, capacitors, inductors, resistors, other suitable elements or combinations of the above elements may be included between the ends of the elements on two circuits, but not limited thereto.

According to the present disclosure, the thickness, length and width may be measured through optical microscope, and the thickness or width may be measured through the cross-sectional view in the electron microscope, but not limited thereto. In addition, any two values or directions used for comparison may have certain errors. In addition, the terms "equal to", "equal", "the same", "approximately" or "substantially" are generally interpreted as being within +10% of the given value. In addition, the terms "the given range is from a first value to a second value" or "the given range is located between a first value to a second value" represents that the given range includes the first value, the second value and other values there between. If a first direction is said to be perpendicular to a second direction, the included angle between the first direction and the second direction may be located between 80 to 100 degrees. If a first direction is said to be parallel to a second direction, the included angle between the first direction and the second direction may be located between 0 to 10 degrees.

Unless it is additionally defined, all terms (including technical and scientific terms) used herein have the same meaning as commonly understood by those ordinary skilled in the art. It can be understood that these terms that are defined in commonly used dictionaries should be interpreted as having meanings consistent with the relevant art and the background or content of the present disclosure, and should not be interpreted in an idealized or overly formal manner, unless it is specifically defined in the embodiments of the present disclosure.

In the present disclosure, the electronic device may include a display device, a backlight device, an antenna device, a sensing device or a tiled device, but not limited thereto. The electronic device may be a foldable electronic device or a flexible electronic device. The display device may be a non-self-luminous display device or a self-luminous display device. The antenna device may be a liquid crystal antenna device or a non-liquid crystal antenna device. The sensing device may be sensing devices capable of sensing capacitance, light, heat or ultrasound, but not limited thereto. In the present disclosure, the electronic element may include passive elements and active elements such as capacitors, resistors, inductors, diodes, transistors, and the like. The diode may include a light emitting diode or a photodiode. The light emitting diodes may for example include an organic light emitting diode (OLED), a mini light emitting diode (mini LED), a micro light emitting diode (micro LED) or a quantum dot light emitting diode (QLED), but not limited thereto. The tiled device may for example be a tiled display device or a tiled antenna device, but not limited thereto. It should be noted that the electronic device may be combinations of the above-mentioned devices, but not limited thereto. The display device is taken as an example of the electronic device or the tiled device to describe the present disclosure in the following, but the present disclosure is not limited thereto.

It should be noted that the technical features in different embodiments described in the following can be replaced, recombined, or mixed with one another to constitute another embodiment without departing from the spirit of the present disclosure.

Referring to FIG. 1 to FIG. 6, FIG. 1 is a flow chart of a manufacturing method of an electronic device according to a first embodiment of the present disclosure, and FIG. 2 to FIG. 6 schematically illustrate the device structures in the manufacturing process of the electronic device according to the first embodiment of the present disclosure. The electronic device of the present disclosure (such as the electronic device ED shown in FIG. 6) may for example include a display device, but not limited thereto. As an example, the electronic device ED of the present disclosure may serve as the tiling unit of a tiled electronic device, and the tiled electronic device may be formed by tiling a plurality of electronic devices ED, but not limited thereto. According to the present embodiment, the manufacturing method M100 of the electronic device ED may include the following steps:

S102: providing a first substrate, wherein the first substrate includes a circuit layer and an electronic element disposed on the circuit layer;

S104: providing a second substrate;

S106: disposing a first glue and a second glue surrounding the first glue between the first substrate and the second substrate;

S108: bonding the first substrate and the second substrate to form an electronic module;

S110: cutting the electronic module;

S111: performing a polishing process;

S112: forming a wire on a first surface which is exposed after cutting the electronic module and on a second surface of the electronic module, wherein the first surface is adjacent to the second surface, and the wire is electrically connected to the circuit layer;

S114: forming an encapsulating layer on the first surface which is exposed after cutting the electronic module; and S116: disposing a driving element on the second surface of the electronic module to be electrically connected to the wire.

Each step of the manufacturing method M100 will be detailed in the following.

Figure 2:
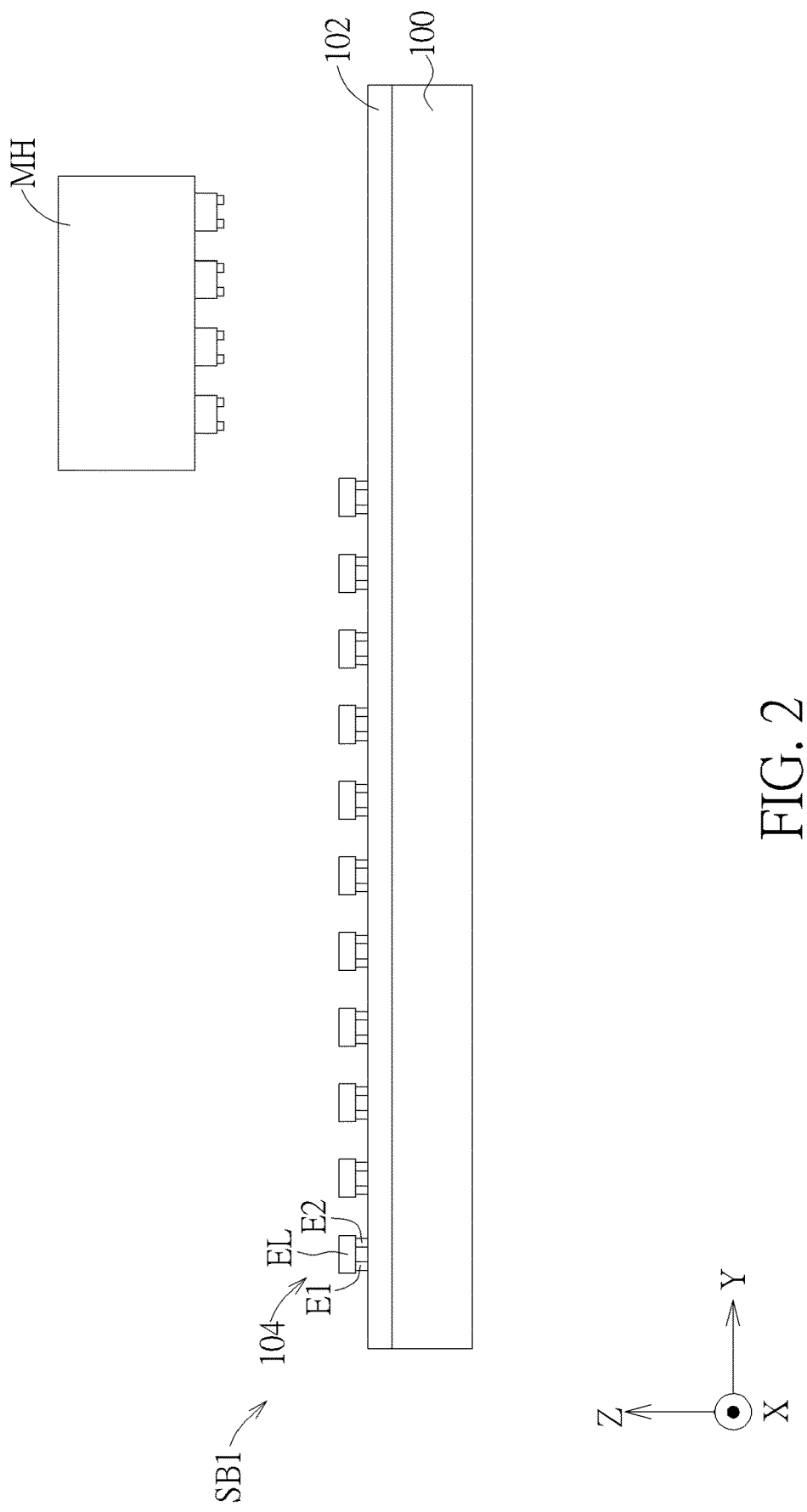
FIG. 2, FIG. 3, FIG. 4, FIG. 5 and FIG. 6 schematically illustrate the device structures in the manufacturing process of the electronic device according to the first embodiment of the present disclosure.

The manufacturing method M100 of the electronic device ED may include the step S102: providing a first substrate SB1. FIG. 2 schematically illustrates a cross-sectional view of the first substrate SB1 of the present embodiment. As shown in FIG. 2, the first substrate SB1 may include a first base 100, a circuit layer 102 and electronic elements 104 disposed on the circuit layer 102. The first base 100 may include a flexible base, a rigid base or combinations of the above-mentioned bases, but not limited thereto. The material of the flexible base may for example include polyimide (PI), polycarbonate (PC), polyethylene terephthalate (PET), other suitable materials or combinations of the above-mentioned materials, but not limited thereto. The material of the rigid base may for example include glass, ceramic, quartz, sapphire or combinations of the above-mentioned materials, but not limited thereto. In some embodiments, the first base 100 may include a single-layer structure, a multi-layer structure or a composite structure. In some embodiments, the circuit layer 102 may be disposed between the first base 100 and the electronic elements 104. In some embodiments, the circuit layer 102 may include connecting pads, wires and driving circuits, but not limited thereto. In some embodiments, the electronic elements 104 may for example include passive elements and active elements, such as capacitors, resistors, inductors, diodes, transistors, and the like, which may refer to the above-mentioned examples, but not limited thereto. As shown in FIG. 2, the electronic element 104 may include a diode unit EL, a first electrode E1 and a second electrode E2, wherein the first electrode E1 and the second electrode E2 may for example be located at the same side of the diode unit EL, but not limited thereto. The electronic elements 104 may be disposed on the circuit layer 102 through any suitable way. For example, the electronic elements 104 may be transferred onto the circuit layer 102 through a transfer head MH, but not limited thereto. Although it is not shown in FIG. 2, after the electronic elements 104 are disposed on the circuit layer 102, a filling material (not shown) may be selectively disposed around the electronic elements 104 and/or above the circuit layer 102, and the electronic elements 104 may be fixed on the circuit layer 102 by the filling material, but not limited thereto. In some embodiments, the filling material may be selected from materials with good leveling, low curing shrinkage, low thermal expansion coefficient, high transmittance or high reflectivity, or other suitable materials, but not limited thereto. For example, the filling material may include acrylic resin, epoxy resin, siloxane, silicone, other suitable materials or combinations of the above-mentioned materials.

Figure 3:
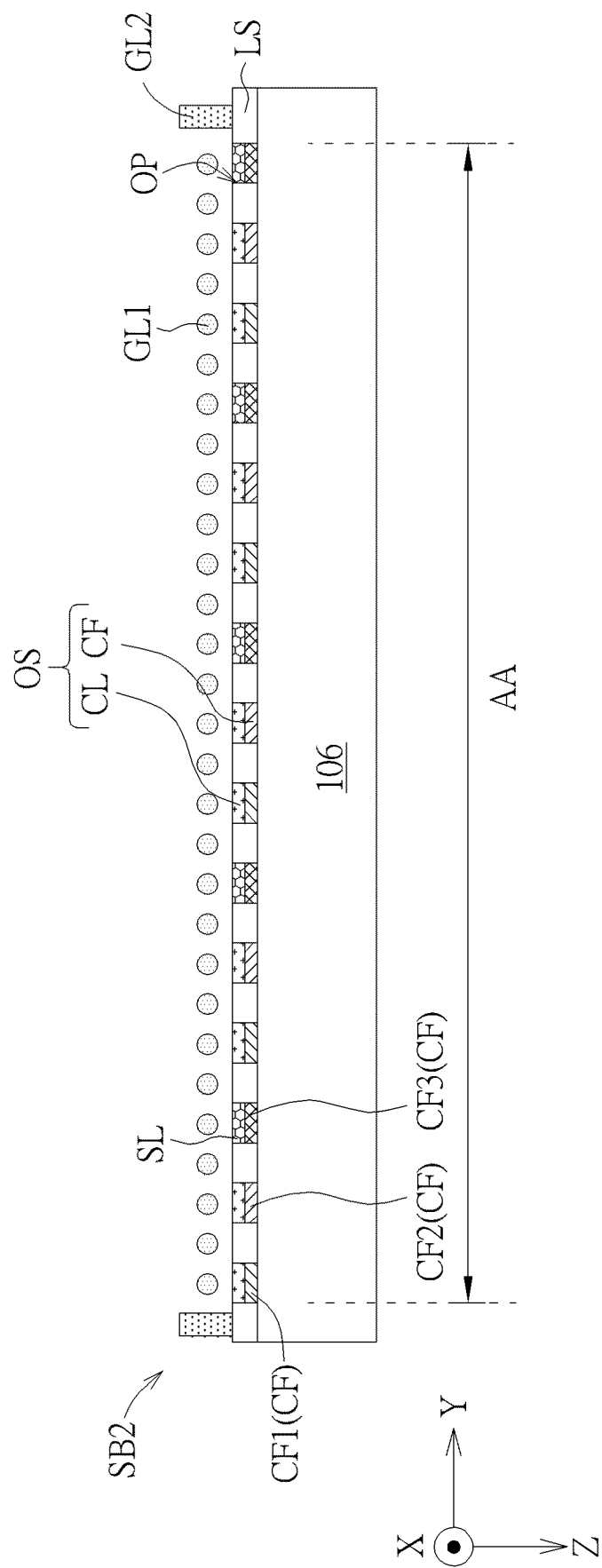

The manufacturing method M100 of the electronic device ED may include the step S104: providing a second substrate SB2. FIG. 3 schematically illustrates a cross-sectional view of the second substrate of the present embodiment. As shown in FIG. 3, the second substrate SB2 may include a second base 106, a light shielding structure LS and/or an optical structure OS, but not limited thereto. The material of the second base 106 may refer to the material of the above-mentioned first base 100. The light shielding structure LS may be disposed on the second base 106. In some embodiments, the light shielding structure LS may include a plurality of openings OP, and the optical structure OS may for example be overlapped with the openings OP in a normal direction of the second base 106 (such as the direction Z). In some embodiments, the optical structure OS may be disposed in the openings OP of the light shielding structure LS. In some embodiments, the light shielding structure LS may for example include black matrix or other suitable materials, but not limited thereto. In some embodiments, the optical structure OS may include color filter CF, light converting layer CL, light scattering material (not shown), other suitable materials or combinations of the above-mentioned materials, but not limited thereto. According to the design of the electronic device ED, different openings OP may include color filters CF of the same color or different colors. For example, the second substrate SB2 shown in FIG. 3 may include color filters CF1, color filters CF2 and/or color filters CF3 which are respectively be the red color filters, the green color filters and the blue color filters, but not limited thereto. The color filters CF may be filters of other colors according to the demands. In FIG. 3, a red sub-pixel, a green sub-pixel and a blue sub-pixel may respectively be defined through the positions of the color filter CF1, the color filter CF2 and the color filter CF3, wherein these sub-pixels may compose a pixel, but not limited thereto. In other embodiments, the colors, numbers and/or arrangement of the sub-pixels in the pixel may be varied according to the demands.

In some embodiments, as shown in FIG. 3, the optical structure OS may selectively include the light converting layer CL, and the light converting layer CL may for example be disposed on the color filters CF, that is, the color filters CF may be disposed between the light converting layer CL and the second base 106, but not limited thereto. In some embodiments, the light converting layer CL that converts the light emitted from the electronic elements 104 into red light may for example be disposed on the red color filters CF1, and the light converting layer CL that converts the light emitted from the electronic elements 104 into green light may be disposed on the green color filters CF2, but not limited thereto. In some embodiments, when the electronic elements 104 emits blue light, the light converting layer CL may not be disposed on the color filters CF3, and a scattering layer SL may selectively be disposed on the color filters CF3. That is, the color filter CF may be disposed between the scattering layer SL and the second base 106. In some embodiments, the light converting layer CL may include any suitable light converting material such as quantum dot, phosphor, fluorescent, other suitable materials or combinations of the above-mentioned materials. Although it is not shown in FIG. 3, the second substrate SB2 of the present embodiment may include a protecting layer (not shown) disposed on the optical structure OS and/or the light shielding structure LS.

It should be noted that the step S102 and the step S104 of the manufacturing method M100 may be performed in any suitable order, or the step S102 and the step S104 may be performed simultaneously. In addition, other steps may be inserted between the steps in the manufacturing method M100 according to the demands. Furthermore, any step in the manufacturing method M100 may be adjusted in order or deleted according to the demands.

Referring to FIG. 1 and FIG. 3, after the first substrate SB1 and the second substrate SB2 are formed, the step S106 may be performed to form the first glue GL1 and the second glue GL2 surrounding the first glue GL1 between the first substrate SB1 and the second substrate SB2. Specifically, the first glue GL1 may be disposed on the first substrate SB1 or the second substrate SB2, and the second glue GL2 may be disposed on the first substrate SB1 or the second substrate SB2. In other words, the first glue GL1 and the second glue GL2 may be disposed on the same substrate or different substrates according to the demands.

FIG. 3 shows the structure that the first glue GL1 and the second glue GL2 are disposed on the second substrate SB2, but the present embodiment is not limited thereto. As shown in FIG. 3, the first glue GL1 may be disposed on the light shielding structure LS and/or the optical structure OS, and the second glue GL2 may surround the first glue GL1. It should be noted that the first glue GL1 and the second glue GL2 may be disposed on the second substrate SB2 or the first substrate SB1 in any suitable order. As shown in FIG. 3, the second glue GL2 may be disposed on the second substrate SB2 at first, and then the first glue GL1 may be disposed in the region enclosed by the second glue GL2. Alternatively, the first glue GL1 may be disposed on the second substrate SB2 at first, and then the second glue GL2 may be formed and surrounds the first glue GL1.

Figure 4:
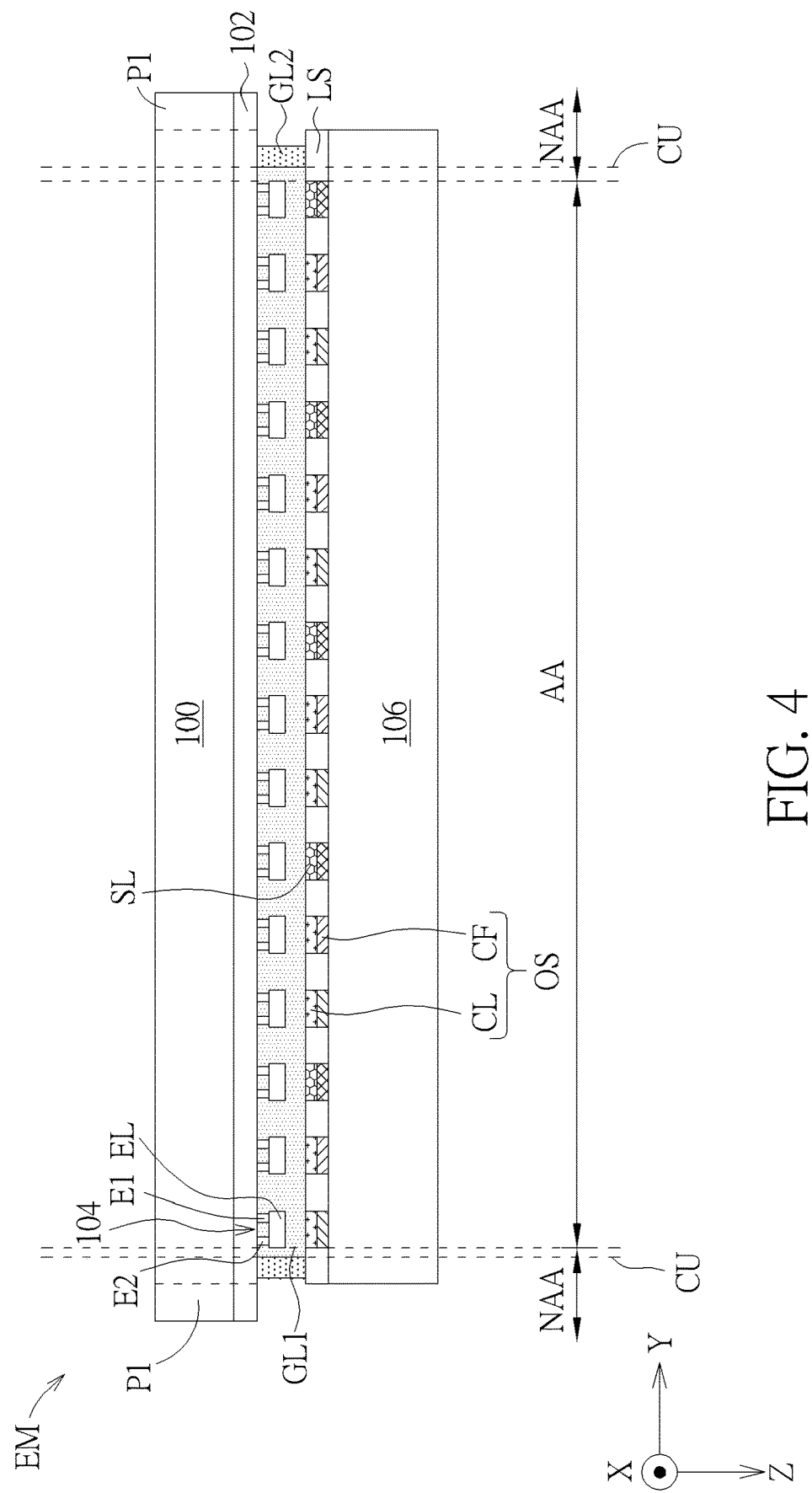

Referring to FIG. 4, FIG. 4 schematically illustrates a cross-sectional view of an electronic module of the present embodiment. After the step S106 is finished, the step S108 may be performed to bond the first substrate SB1 and the second substrate SB2 to form the electronic module EM. In the step S108, the first substrate SB1 and the second substrate SB2 may be bonded through the first glue GL1 and the second glue GL2 surrounding the first glue GL1, but not limited thereto. In other embodiments (not shown), the first substrate SB1 and the second substrate SB2 may be bonded through other glue. In other embodiments (not shown), the first substrate SB1 and the second substrate SB2 may be bonded through one of the first glue GL1 and the second glue GL2.

In some embodiments, the first glue GL1 may be selected from materials with high transmittance, low curing shrinkage, high adhesive strength, good leveling, solvent-free, and high temperature resistance, but not limited thereto. The material with high transmittance may for example have a light transmittance greater than 95% in the wavelength range of visible light, but not limited thereto. The material with low curing shrinkage may for example have a curing shrinkage lower than 3%, preferably less than 1%, but not limited thereto. In some embodiments, the first glue GL1 may for example include acrylic resin, epoxy resin, siloxane, silicone, other suitable materials or combinations of the above-mentioned materials. In some embodiments, the first glue GL1 may for example include thermal curable materials and/or photo-curable materials, but not limited thereto. Photo-curable materials may for example include UV curing materials. In some embodiments, the second glue GL2 may for example include acrylic resin, epoxy resin, silicone, other suitable materials or combinations of the above-mentioned materials. The second glue GL2 may for example include thermal curable materials and/or photo-curable materials, but not limited thereto. In some embodiments, the material of the first glue GL1 and the material of the second glue GL2 may be the same or different.

In some embodiments, the electronic device ED may include an active region AA and/or a non-active region NAA, and the non-active region NAA may for example be adjacent to or surround the active region AA. In some embodiments, the second glue GL2 may substantially surround the active region AA, but not limited thereto. The active region AA may for example be defined as the operating region (such as the light emitting region or the display region) of the electronic device ED, and the non-active region NAA may for example be the region other than the active region AA. For example, when the electronic device ED includes the light shielding structure LS, the operating region may for example be defined as the region enclosing the openings OP of the light shielding structure LS, but not limited thereto. In other embodiments (not shown), when the electronic device ED does not include the light shielding structure LS and/or the optical structure OS, the electronic elements 104 of the electronic device ED may for example include light emitting elements capable of emitting lights of different colors, but not limited thereto.

"The second glue GL2 substantially surrounds the active region AA" mentioned above may include the conditions that a portion of the second glue GL2 is overlapped with the active region AA or the second glue GL2 is not overlapped with the active region AA in the normal direction (such as the direction Z) of the first substrate 106. When the second glue GL2 is overlapped with the active region AA in the normal direction (such as the direction Z) of the first substrate 106, the second glue GL2 may for example be selected from the materials with high transmittance, but not limited thereto.

Referring to FIG. 4, in some embodiments, in the step S108 (bonding the first substrate SB1 and the second substrate SB2 to form the electronic module EM), the second substrate SB2 may be bonded to the first substrate SB1 in the way that the optical structure OS is toward the electronic elements 104, but not limited thereto. In some embodiments, the first substrate SB1 and the second substrate SB2 may for example be bonded to each other in a vacuum chamber, but not limited thereto. In some embodiments, the first substrate SB1 may at least include a portion protruding from the second substrate SB2, such as the portion P1, but not limited thereto. In some embodiments, test circuits (not shown) and/or test pads (not shown) may be disposed on the portion P1, wherein the test circuits and/or the test pads may be used to test the electronic elements 104 before performing the subsequent processes, but not limited thereto. Accordingly, the yield of the formed electronic device ED may be improved.

Figure 5:
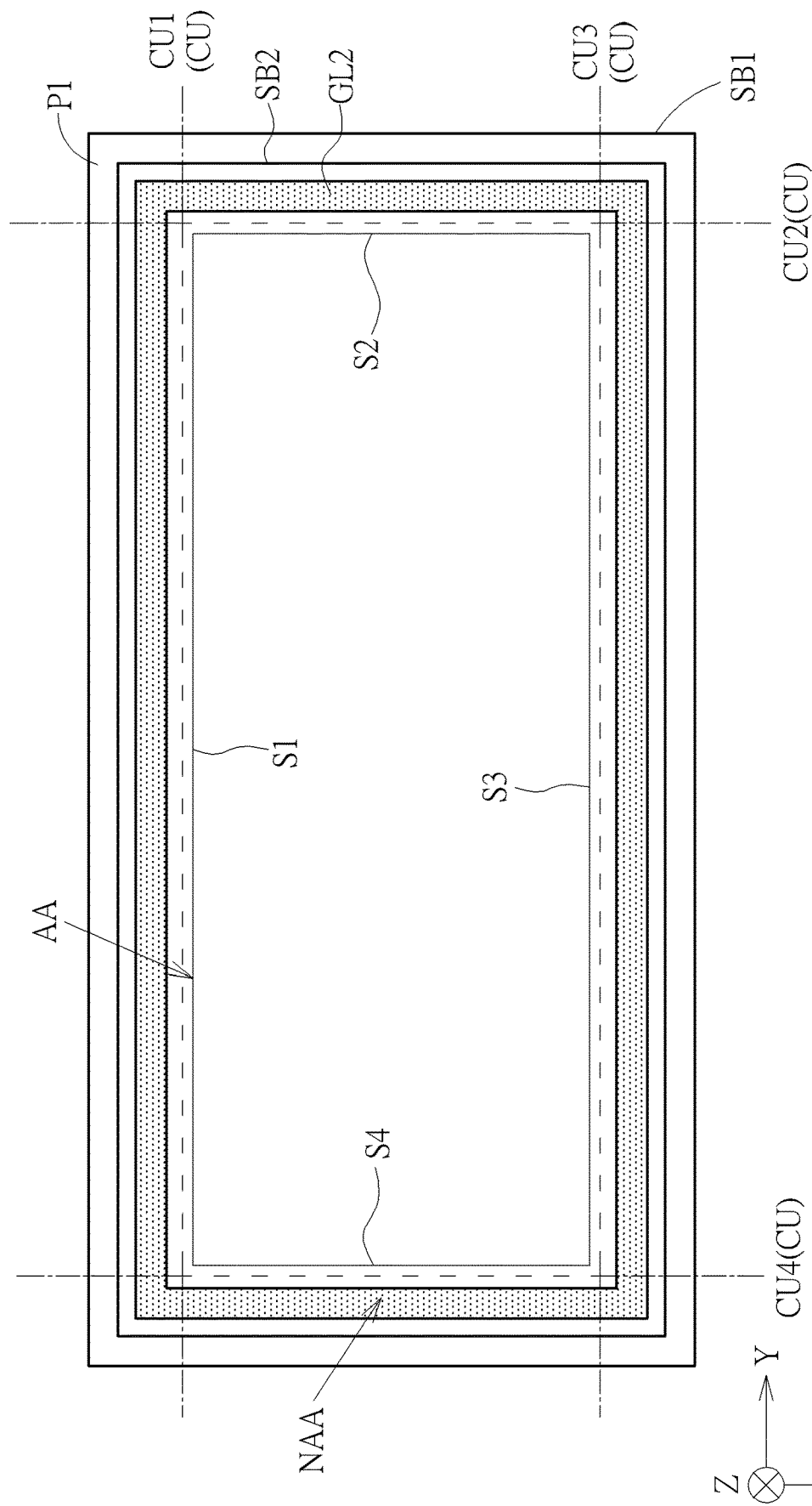

FIG. 5 schematically illustrates a top view of the electronic module of the present embodiment. Referring to FIG. 1, FIG. 4 and FIG. 5, after the electronic module EM is formed, the step S110 may be performed to cut the electronic module EM. In the step S110, the electronic module EM may be cut along at least one cutting line CU, the cutting lines (such as the cutting line CU1, the cutting line CU2, the cutting line CU3 and the cutting line CU4) may correspond to the non-active region NAA and respectively be adjacent to different sides (such as the side S1, the side S2, the side S3 and/or the side S4) of the active region AA, but not limited thereto. In other embodiments, these cutting lines CU (such as the cutting line CU1, the cutting line CU2, the cutting line CU3 and the cutting line CU4) may correspond to the boundary of the non-active region NAA and the active region AA, thereby improving the effect of narrow bezel or no bezel, but not limited thereto. The cutting process of the electronic module EM may be performed through any suitable cutting method, such as wheel cutting, laser cutting or other suitable methods, but not limited thereto. It should be noted that the design of the positions of the cutting lines in the cutting process of the present embodiment is not limited to the above-mentioned contents. The shape of the active region AA shown in FIG. 5 is just an example, and the active region AA may include any suitable shape, wherein the positions of the cutting lines CU may selectively be varied according to the shape of the active region AA.

Figure 6:
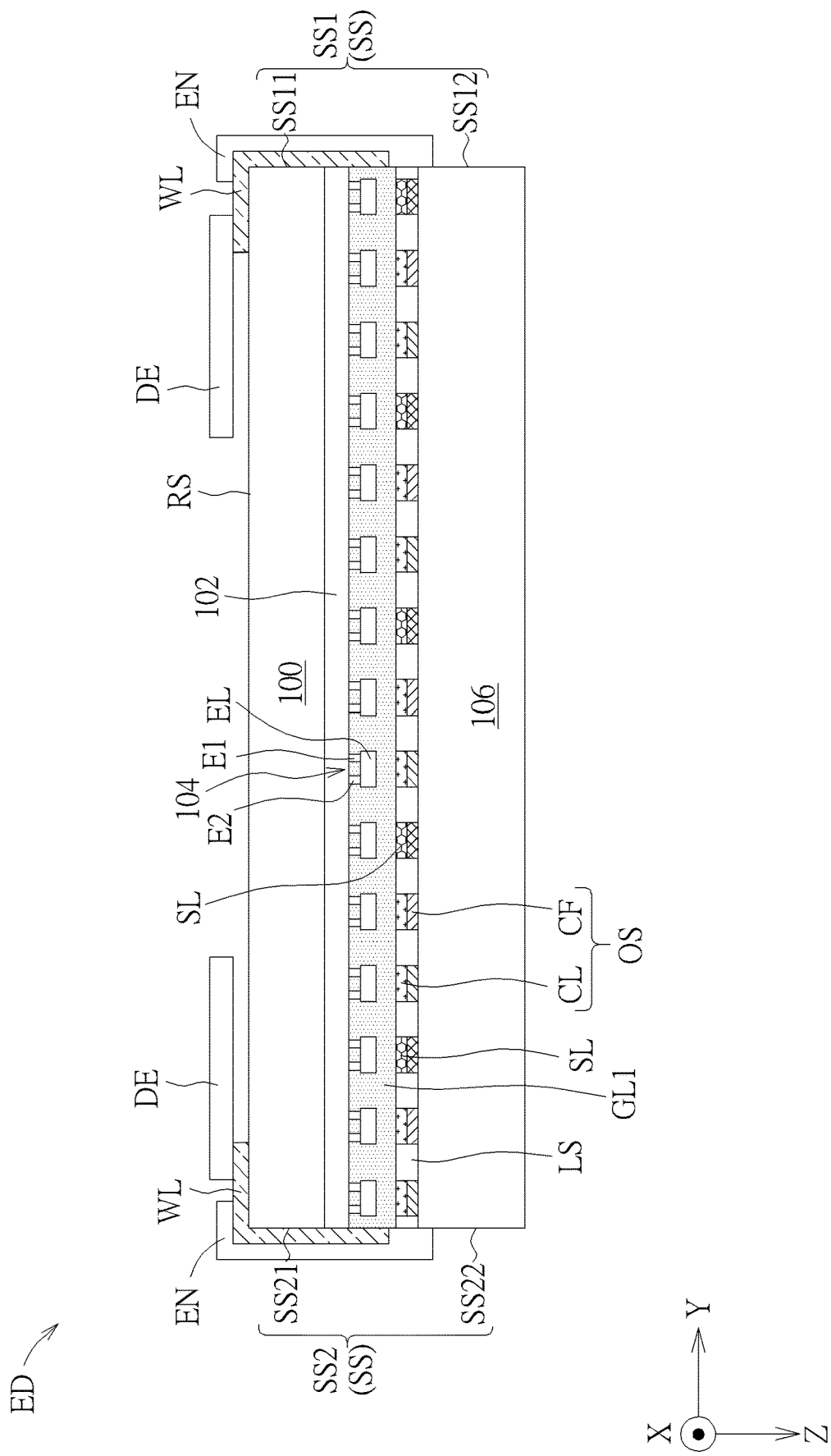

As shown in FIG. 6, after the electronic module EM is cut, a side surface SS of the electronic module EM may be exposed, and the side surface SS may for example include a side surface SS1 and/or a side surface SS2, but not limited thereto. In detail, the side surface SS1 may include a side surface SS11 of the first substrate SB1 and a side surface SS12 of the second substrate SB2, but not limited thereto. The side surface SS2 may include a side surface SS21 of the first substrate SB1 and a side surface SS22 of the second substrate SB2, but not limited thereto.

It should be noted that after the electronic module EM is cut, a portion of the electronic module EM may be removed, and the portion of the electronic module EM including the active region AA may be remained. In some embodiments, the electronic device ED formed through the manufacturing method M100 may not include the second glue GL2 and/or the portion P1, but not limited thereto. In other embodiments (not shown), the electronic device ED formed through the manufacturing method M100 may include a portion of the second glue GL2 and/or a portion of the portion P1.

As shown in FIG. 6, according to the present embodiment, the step S111, performing a polishing process, may be performed after the cutting process of the electronic module EM. The polishing process may include polishing the exposed first surface of the electronic module EM after cutting the electronic module EM, wherein the first surface may for example be the side surface SS (including the side surface SS1 and/or the side surface SS2) of the electronic module EM exposed after the cutting process, but not limited thereto. Referring to FIG. 1 and FIG. 6, after the cutting process or the polishing process of the electronic module EM, the step S112 may be performed to form the wires WL on the first surface which is exposed after cutting the electronic module EM and on the second surface of the electronic module EM, wherein the second surface may be adjacent to the first surface. In detail, the first surface may be the side surface SS mentioned above, and the second surface may be a rear surface RS of the first substrate SB1, wherein the rear surface RS may be adjacent to the side surface SS. The rear surface RS of the first substrate SB1 may for example be the surface of the first substrate SB1 away from the operating surface (such as the display surface, but not limited thereto) of the user. In other words, in the step S112, the wires WL may for example be formed on the side surface SS and on the rear surface RS of the first substrate SB1. In some embodiments, the wires WL may be disposed on at least one side surface SS (side surface SS1 and/or side surface SS2) and extend to the rear surface RS of the first substrate SB1. In some embodiments, the wires WL may for example be electrically connected to the circuit layer 102, and the wires WL may be electrically connected to the electronic elements 104 through the circuit layer 102, but not limited thereto. The number of the wires WL shown in FIG. 6 is just an example, and the number of the wires WL may be adjusted according to the demands. In some embodiments, the portion of the wire WL on the side surface SS may have any suitable length or extending direction, and the present disclosure is not limited thereto. For example, the portion of the wire WL on the side surface SS may selectively extend to and be in contact with the second base 106 of the second substrate SB2, but not limited thereto.

In some embodiments, the wires WL may for example be formed on the first surface and the second surface of the electronic module EM through the printing process, but not limited thereto. In some embodiments, the material of the wires WL may for example include metal particles, metal debris, metal column, and the like. The characteristic of the material of the wires WL may be adjusted according to the demands, and the material of the wires WL may for example be ink, glue, photoresist, target material, but not limited thereto. In some embodiments, the above-mentioned metal may include silver, copper, gold, palladium, platinum, nickel, molybdenum, titanium, aluminum, other suitable metals or alloys of the above-mentioned metals, but not limited thereto. In some embodiments, the material of the wires WL may include low-temperature-sintered materials, and the sintering temperature may be about 150° C., but not limited thereto. the present embodiment, the sintering temperature of the material of the wires WL may be adjusted according to the materials of the first glue GL1 and/or the second glue GL2.

Since the wires WL are formed after the first substrate SB1 and the second substrate SB2 are bonded to each other, in order to reduce the effect of the process for forming the wires WL on the elements (such as the first glue LG1, the second glue GL2 or other elements) of the electronic module EM, the material of the wires WL may be selected from the materials with lower sintering temperature, but not limited thereto. In some embodiments, the first glue GL1 and/or the second glue GL2 may include the materials with high temperature resistance, thereby improving the yield of the electronic device ED.

Referring to FIG. 6 and FIG. 1, after the wires WL are disposed on the electronic module EM, the step S114 may be performed to form the encapsulating layer EN on the first surface which is exposed after cutting the electronic module EM, wherein the first surface may be the side surface SS mentioned above. In some embodiments, the encapsulating layer EN may cover the wire WL disposed on the side surface SS1 and/or the side surface SS2. In some embodiments, the encapsulating layer EN may cover a portion of the wire WL disposed on the rear surface RS. In some embodiments, the encapsulating layer EN may include any suitable organic material, inorganic material or combinations of the above-mentioned materials. In some embodiments, the organic material may for example include acrylic resin, epoxy resin, siloxane, silicone, other suitable materials or combinations of the above-mentioned materials. The inorganic material may include silicon nitride, silicon oxide, liquid glass, glass glue, titanium dioxide, aluminum oxide, other suitable materials or combinations of the above-mentioned materials.

Although the encapsulating layer EN shown in FIG. 6 is a single layer, the present disclosure is not limited thereto. In some embodiments (not shown), the encapsulating layer EN may be a multi-layer structure. In some embodiments, the encapsulating layer EN may include a multi-layer structure formed by alternately stacking organic materials and inorganic materials. The encapsulating layer EN may be used to protect the wires WL, thereby reducing the possibility that the wires WL are damaged or corroded.

Referring to FIG. 1 and FIG. 6, after the encapsulating layer EN is disposed in the electronic module EM, the step S116 may be performed to dispose the driving element DE on the second surface of the electronic module EM to be electrically connected to the wire WL disposed on the second surface, wherein the second surface may be the rear surface RS of the first substrate SB1 mentioned above. In some embodiments, the driving element DE may for example be electrically connected to the portion of the wire WL not covered by the encapsulating layer EN, and the driving element DE may be electrically connected to the electronic elements 104 through the wire WL and the circuit layer 102 to control the operation of the electronic elements 104. In some embodiments, the driving element DE may include a chip, a printed circuit board, other suitable elements or combinations of the above-mentioned elements. After the driving element DE is disposed in the electronic module EM, the electronic device ED of the present embodiment may thereby be formed.

The manufacturing method of the electronic device according to another embodiment of the present disclosure will be detailed in the following. In order to simplify the description, the same layers or elements in the following embodiments would be labeled with the same symbol, and the features thereof will not be redundantly described.

Referring to FIG. 7 to FIG. 12, FIG. 7 is a flow chart of a manufacturing method of an electronic device according to a second embodiment of the present disclosure, and FIG. 8 to FIG. 12 schematically illustrate the device structures in the manufacturing process of the electronic device according to the second embodiment of the present disclosure. According to the present embodiment, the manufacturing method M200 of the electronic device ED (shown in FIG. 12) may include the following steps:

S202: providing a first substrate, wherein the first substrate includes a circuit layer; S204: cutting the first substrate;

S205: performing a polishing process on a first surface which is exposed after cutting the first substrate;

S206: forming a wire on the first surface which is exposed after cutting the first substrate and on a second surface of the first substrate;

S208: forming an encapsulating layer on the wire;

S210: disposing electrical elements on the circuit layer;

S212: providing a second substrate;

S214: forming a first glue and a second glue surrounding the first glue between the first substrate and the second substrate;

S216: bonding the first substrate after cutting and the second substrate to form an electronic module;

S218: cutting the electronic module;

S219: polishing a surface which is exposed after cutting the electronic module; and S220: disposing a driving element on the second surface of the first substrate to be electrically connected to the wire.

It should be noted that other steps may be inserted between the steps in the manufacturing method M200 according to the demands. In addition, any step in the manufacturing method M200 may be adjusted in order or deleted according to the demands.

Each step of the manufacturing method M200 of the electronic device ED will be detailed in the following.

Figure 8:
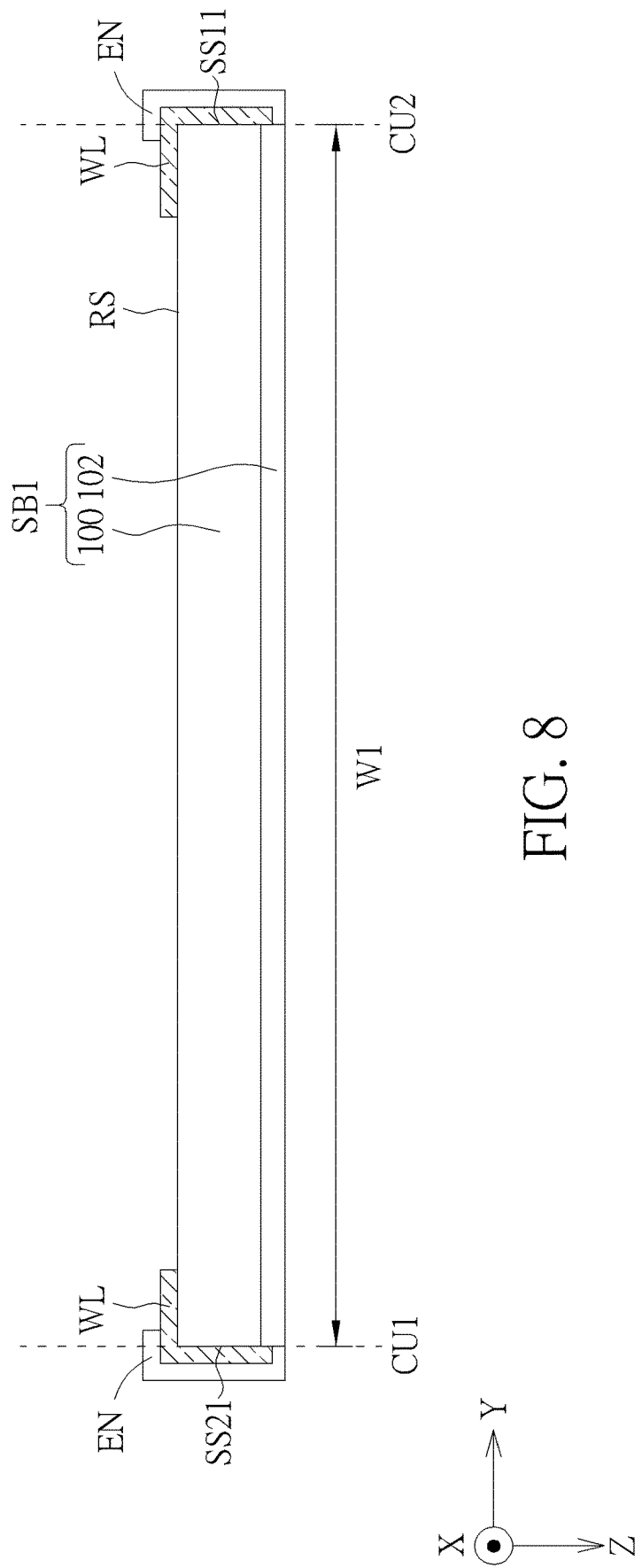
FIG. 8, FIG. 9, FIG. 10, FIG. 11 and FIG. 12 schematically illustrate the device structures in the manufacturing process of the electronic device according to the second embodiment of the present disclosure.

FIG. 8 schematically illustrates a cross-sectional view of the first substrate SB1 of the present embodiment. The manufacturing method M200 of the electronic device ED may include the step S202: providing the first substrate SB1, wherein the first substrate SB1 may include a first base 100 and the circuit layer 102, but not limited thereto. The features of the first base 100 and the circuit layer 102 may refer to the contents in the first embodiment, and will not be redundantly described here.

Then, the step S204 may be performed to cut the first substrate SB1. In detail, as shown in FIG. 8, the first substrate SB1 may be cut along a cutting line CU1 and/or a cutting line CU2, but not limited thereto. In other words, the first substrate SB1 shown in FIG. 8 may for example be the portion of the original first substrate remained after the cutting process. As shown in FIG. 8, a side surface SS11 and/or a side surface SS21 may be exposed after the first substrate SB1 is cut along the cutting line CU1 and/or the cutting line CU2. In some embodiments, after the cutting process is performed, the step S205 may be performed to selectively perform a polishing process on the first surface which is exposed after cutting the first substrate SB1, but not limited thereto. The first surface mentioned above may be the side surface SS11 and/or the side surface SS21 exposed after the first substrate SB1 is cut.

As shown in FIG. 1 and FIG. 8, after the first substrate SB1 is cut and/or the polishing process is performed, the step S206 may be performed to form the wires WL on the first surface which is exposed after cutting the first substrate SB1 and on the second surface of the first substrate SB1, wherein the first surface is adjacent to the second surface, and the wires WL may for example be electrically connected to the circuit layer 102. The first surface may be the side surface SS11 and/or the side surface SS21 mentioned above, and the second surface may be the rear surface RS of the first substrate SB1. In other embodiments (not shown), the wire WL may selectively extend onto a portion of the circuit layer 102, thereby being electrically connected to the circuit layer 102, but not limited thereto. In some embodiments, the wires WL may for example be formed on the first surface and the second surface of the first substrate SB1 through the printing process.

Then, the step S208 may be performed to form the encapsulating layer EN on the wires WL, thereby protecting the wires WL. The material and structure of the encapsulating layer EN may refer to the contents in the manufacturing method M100, and will not be redundantly described.

Figure 9:
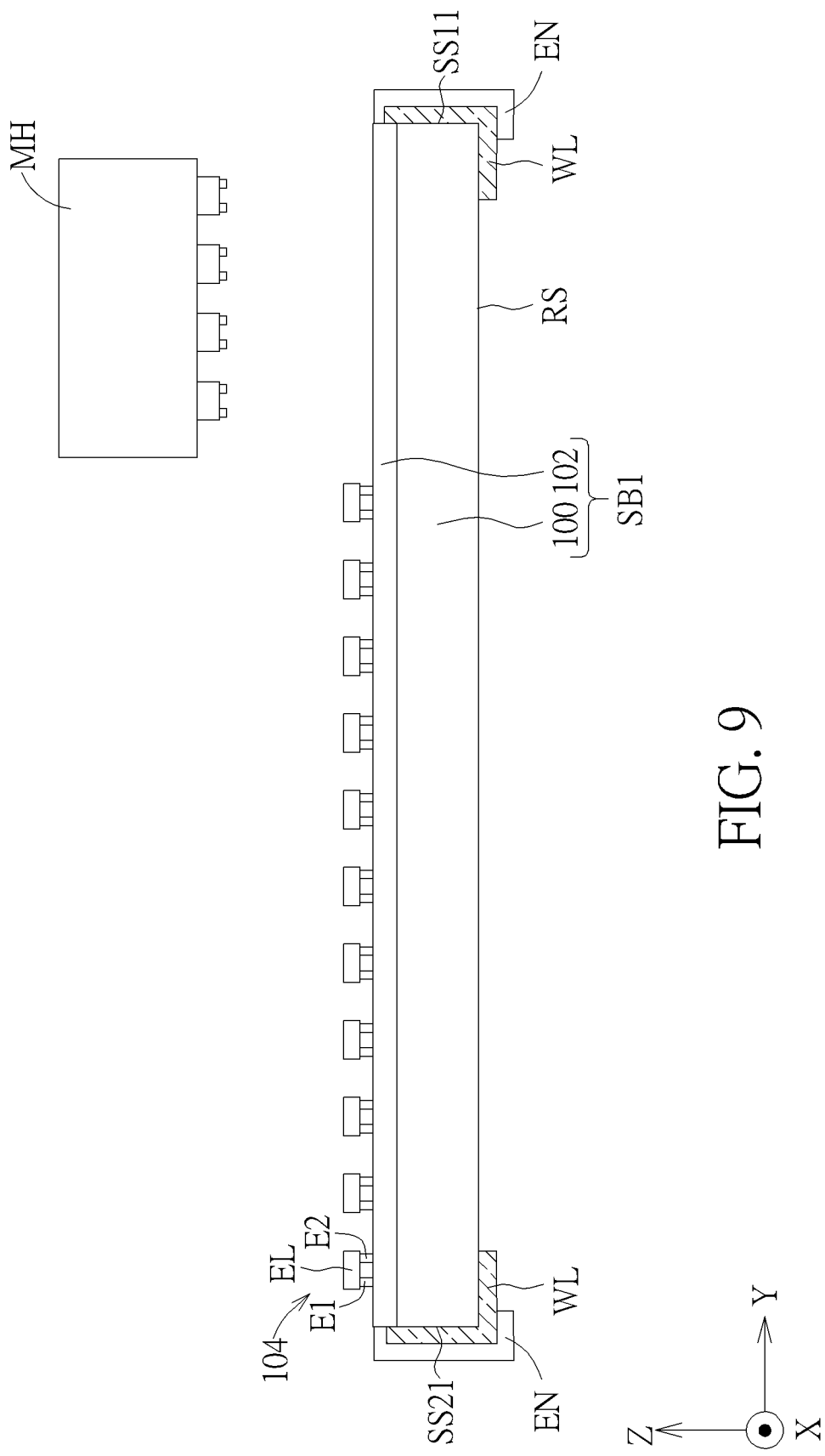

FIG. 9 schematically illustrates a cross-sectional view of the first substrate SB1 of the present embodiment. As shown in FIG. 1 and FIG. 9, after the encapsulating layer EN is formed, the step S210 may be performed to dispose the electronic elements 104 on the circuit layer 102. In other words, the step of disposing the electronic elements 104 on the circuit layer 102 may be performed after the step of forming the wires WL on the first surface which is exposed after cutting the first substrate SB1 and on the second surface of the first substrate. The electronic elements 104 may be electrically connected to the circuit layer 102 through the above-mentioned step S210. The type and disposition way of the electronic elements 104 may refer to the contents in the above-mentioned manufacturing method M100, and will not be redundantly described.

Figure 7:
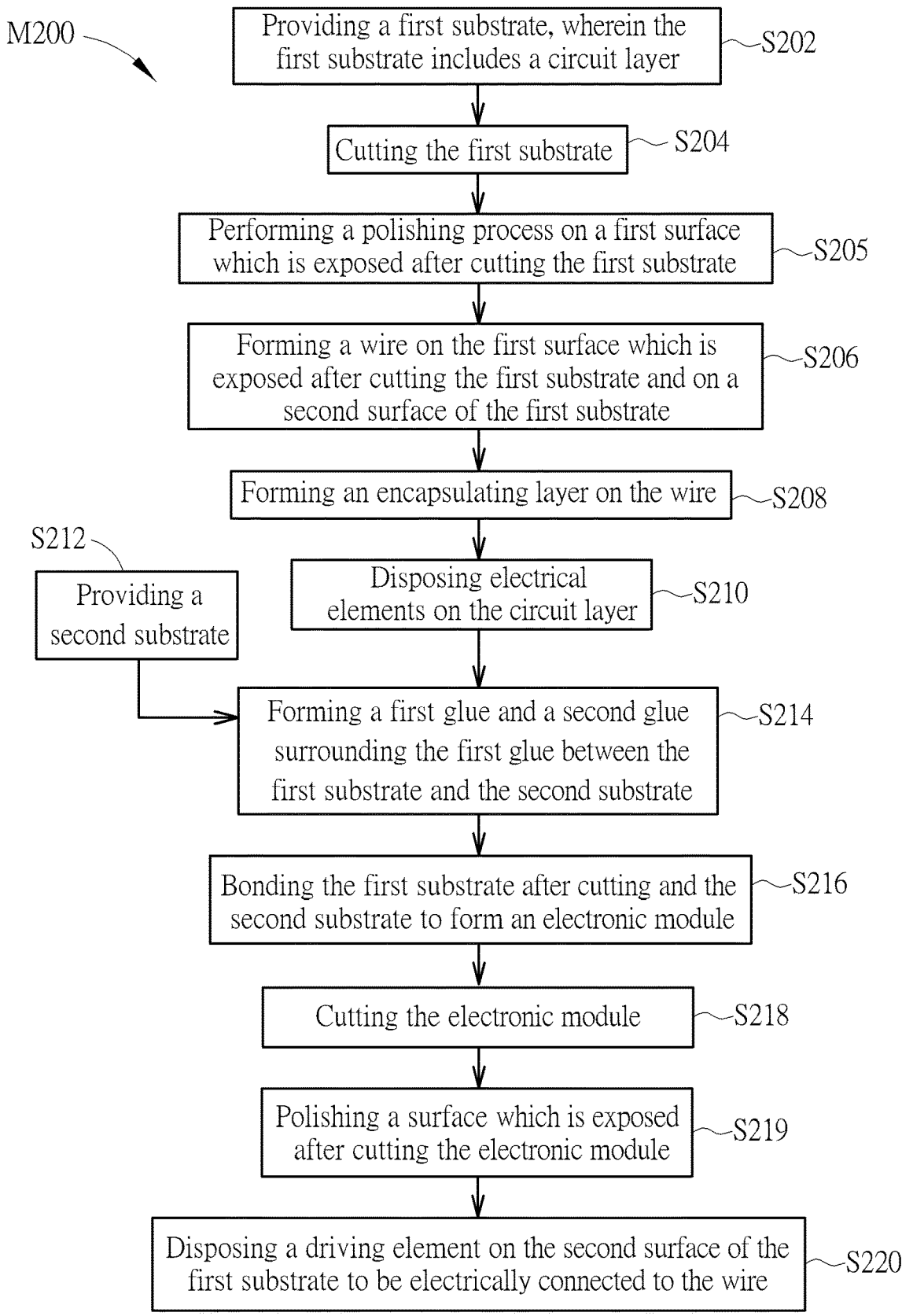
FIG. 7 is a flow chart of a manufacturing method of an electronic device according to a second embodiment of the present disclosure.

As shown in FIG. 7, the manufacturing method M200 of the present embodiment may include the step S212: providing the second substrate SB2. The structure of the second substrate SB2 of the present embodiment may be the same as the structure of the second substrate SB2 in the first embodiment.

The second substrate SB2 of the present embodiment may include an optical structure (refer to the optical structure OS shown in FIG. 10), and the optical structure OS may include a color filter CF. The optical structure OS of the second substrate SB2 of the present embodiment may further include a light converting layer CL disposed on the color filter CF, that is, the color filter CF may be disposed between the light converting layer CL and the second base 106, but not limited thereto. A portion of the optical structure OS may further include a scattering layer SL disposed on the color filter CF in the present embodiment, that is, the color filter CF may be disposed between the scattering layer SL and the second base 106, but not limited thereto.

The second substrate SB2 may be formed in any suitable time, and the present disclosure is not limited thereto.

Figure 10:
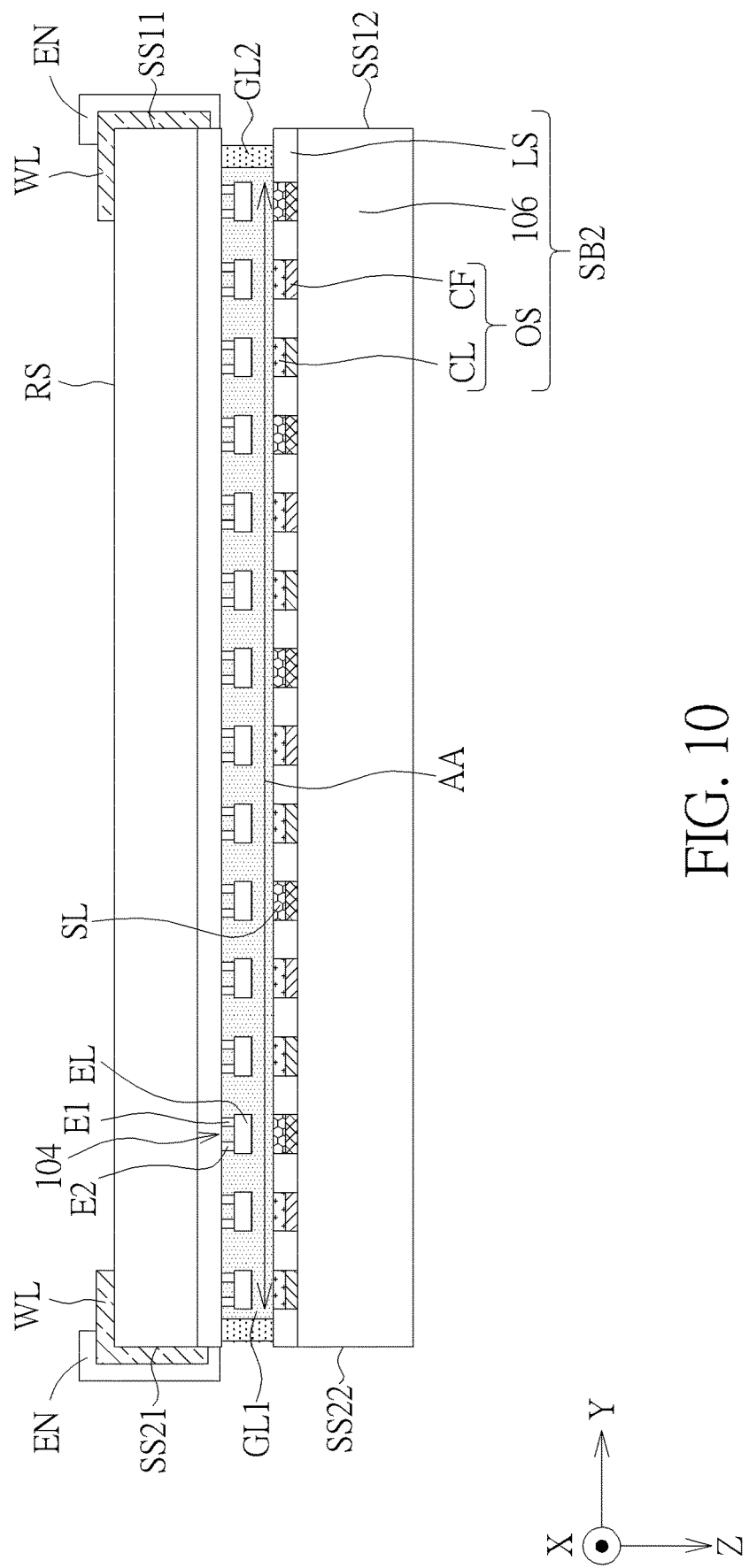

It should be noted that the electronic elements 104 of the present embodiment shown in FIG. 10 may for example emit lights of the same color, such as blue light, but not limited thereto. In other embodiments (not shown), when the electronic elements 104 may respectively emit lights of different colors (such as red light, blue light and/or green light), the optical structure OS of the second substrate SB2 may not include the light converting layer CL, but not limited thereto.

As shown in FIG. 7 and FIG. 10, after that, the step S216 may be performed to bond the first substrate after cutting and the second substrate SB2 to form the electronic module EM. FIG. 10 schematically illustrates a cross-sectional view of the electronic module EM formed by bonding the first substrate SB1 and the second substrate SB2 of the present embodiment. The second surface (that is, the rear surface RS of the substrate SB1) of the first substrate SB1 may for example be away from the second substrate SB2. As shown in FIG. 7, FIG. 9 and FIG. 10, after the step S210 and/or the step S212 are performed, the step S214 may be performed to form the first glue GL1 and the second glue GL2 surrounding the first glue GL1 between the first substrate SB1 and the second substrate SB2, such that the first substrate SB1 being cut and the second substrate SB2 may be bonded to each other through the first glue GL1 and the second glue GL2 surrounding the first glue GL1. In the present embodiment, the first glue GL1 may be disposed on the first substrate SB1 or the second substrate SB2, and the second glue GL2 may be disposed on the first substrate SB1 or the second substrate SB2. In the present embodiment, the first glue GL1 and the second glue GL2 may be disposed on the same substrate or different substrates. The disposition ways of the first glue GL1 and the second glue GL2 may refer to the contents in the above-mentioned first embodiment.

In the manufacturing method M200, since the step of forming the wire WL is performed before the step S216, the material of the wire WL is less limited than the material of the wire WL in the manufacturing method M100. The material of the wire WL in the manufacturing method M200 may refer to the contents in the above-mentioned manufacturing method M100, and will not be redundantly described. In the manufacturing method M200, the material of the wire WL may be selected from low-temperature-sintered materials or high-temperature-sintered materials according to the demands.

As shown in FIG. 7 to FIG. 10, in the manufacturing method M200 of the present embodiment, since the wires WL are formed on the first substrate SB1 at first, and then the first substrate SB1 and the second substrate SB2 are bonded to each other, the wires WL may for example not extend onto the second substrate SB2 (such as the side surface SS22 and/or the side surface SS12), but not limited thereto.

Figure 11:
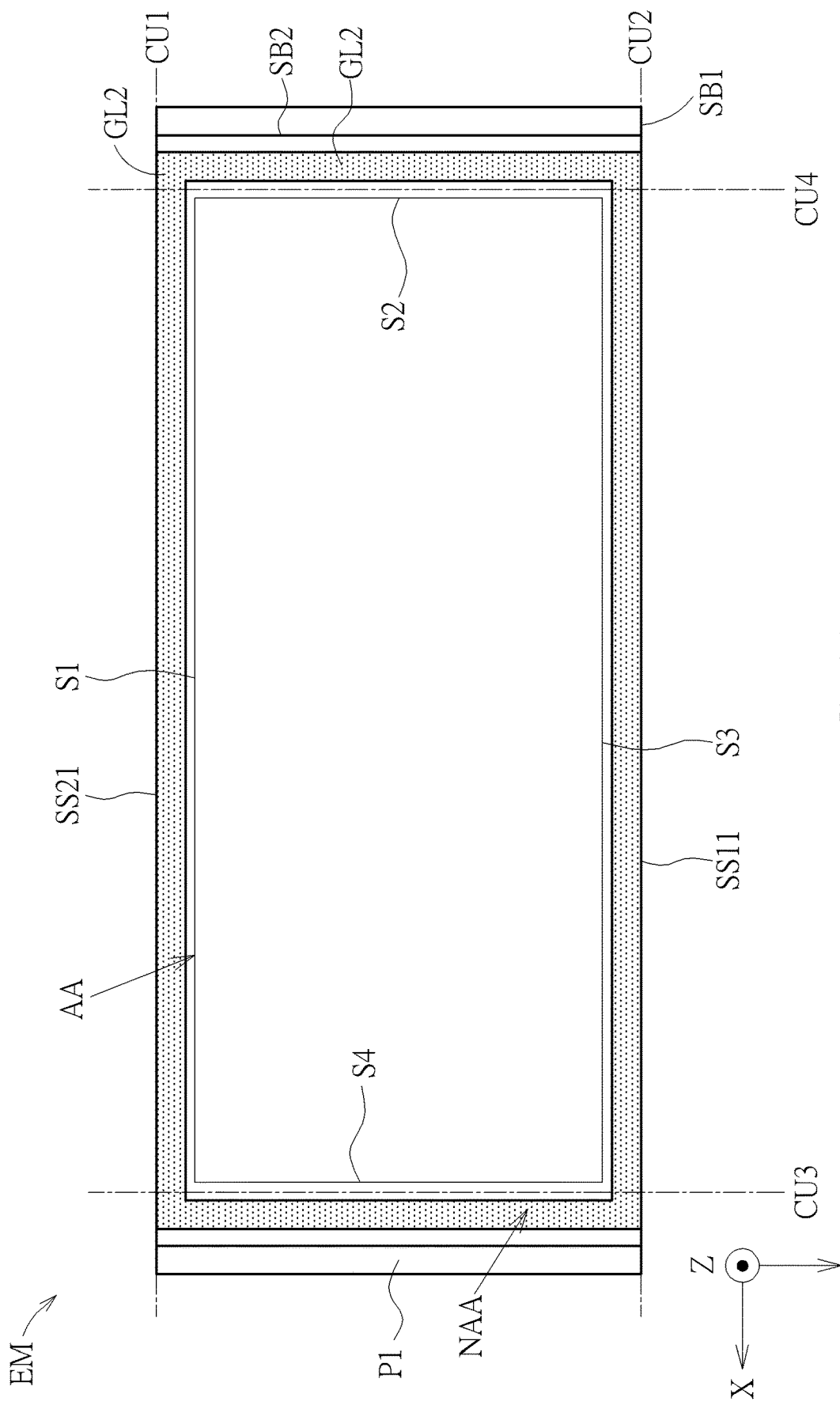

Referring to FIG. 7 and FIG. 11, after the electronic module EM is formed, the step S218 may be performed to cut the electronic module EM. FIG. 11 schematically illustrates a top view of the electronic module EM of the present embodiment. It should be noted that in order to simplify the figure, FIG. 11 only shows the first substrate SB1, the second substrate SB2 and the second glue GL2, and other elements and/or layers are omitted. As shown in FIG. 10 and FIG. 11, a portion of the second glue GL2 may for example not be removed in the cutting process of the electronic module EM. Therefore, the portion of the second glue GL2 may be remained in the electronic module EM.

In detail, according to the present embodiment, since the wires WL and/or the encapsulating layer EN formed on the side surface SS11 and/or the side surface SS21 of the first substrate SB1 needs to be remained after the electronic module EM is cut, the wires WL and/or the encapsulating layer EN may for example not be cut in the step S218. As shown in FIG. 10, after the electronic module EM is formed, the electronic module EM may for example be cut along a cutting line CU3 and/or a cutting line CU4, wherein the extending direction (such as the direction Y) of the cutting line CU3 and/or the cutting line CU4 may for example be different from the extending direction (such as the direction X) of the side surface SS11 and/or the side surface SS21. For example, the extending direction (such as the direction Y) of the cutting line CU3 and/or the cutting line CU4 shown in FIG. 10 may substantially be perpendicular to the extending direction (such as the direction X) of the side surface SS11 and the side surface SS21, but not limited thereto. In some embodiments, the cutting line CU3 and/or the cutting line CU4 may for example be adjacent to the side S4 and/or the side S2 of the active region AA, and the extending direction of the side S4 and/or the side S2 (such as the direction Y) may for example be different from the extending direction of the side surface SS11 and the side surface SS21 (such as the direction X).

As shown in FIG. 7, after the electronic module EM is cut, the step S219 may be performed to polish the surface which is exposed after cutting the electronic module EM, but not limited thereto.

Although FIG. 11 just shows the top view of the electronic module EM before it is cut, the portion P1 of the first substrate SB1 protruding from the second substrate SB2 and a portion of the second glue GL2 (for example, the portion of the second glue GL2 corresponding to the side S2 and the side S4) of the electronic module EM may for example be removed after the electronic module EM is cut along the cutting line CU3 and/or the cutting line CU4. According to the present embodiment, another portion of the second glue GL2 may be remained in the electronic module EM after the cutting process, wherein the another portion of the second glue GL2 may for example be adjacent to the side surface SS11 and the side surface SS21, but not limited thereto. In the present embodiment, the properties of the material of the first glue GL1 and the material of the second glue GL2, such as refractive index after curing, transmittance and/or color, may be similar, thereby reducing the difference between the material of the first glue GL1 and the material of the second glue GL2 that may affect the display effect of the electronic device ED, but not limited thereto. In some embodiments, the material of the first glue GL1 and the material of the second glue GL2 may be the same or different.

Figure 12:
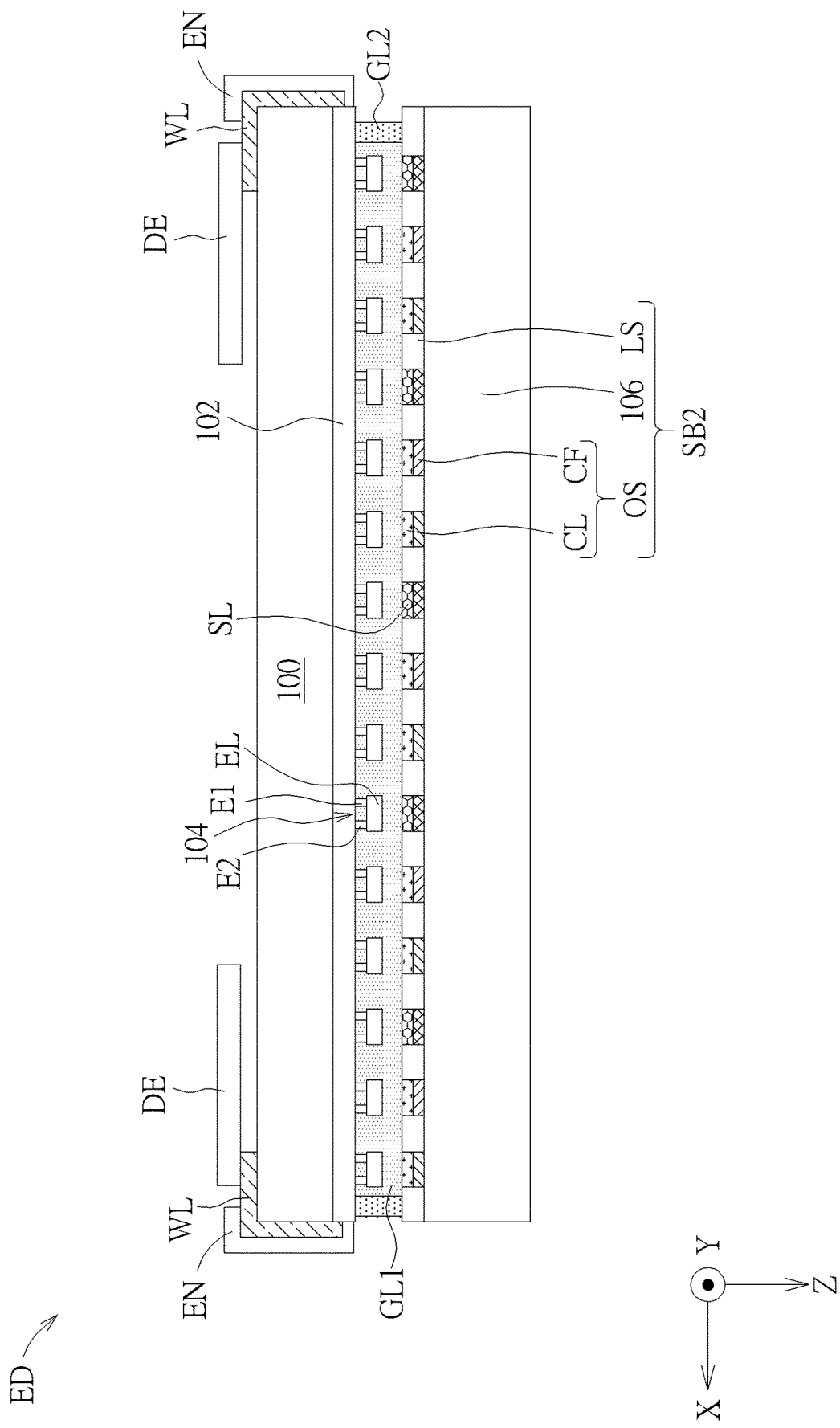

FIG. 12 schematically illustrates a cross-sectional view of the electronic device ED of the present embodiment. As shown in FIG. 7 and FIG. 12, after the cutting process of the electronic module EM is performed, the step S220 may be performed to dispose the driving element DE on the second surface of the first substrate SB1 to be electrically connected to the wires WL, wherein the second surface may be the rear surface RS of the first substrate SB1. In some embodiments, the driving element DE may be electrically connected to the electronic elements 104 through the wires WL to control the operation of the electronic elements 104. The feature of the driving element DE of the present embodiment may refer to the contents in the first embodiment, and will not be redundantly described. After the driving element DE is disposed in the electronic module EM, the electronic device ED of the present embodiment may thereby be formed.

Compared with the manufacturing method M100 of the first embodiment, in the manufacturing method M200 of the present embodiment, the wires WL are formed on the first substrate SB1 at first, and then the first substrate SB1 and the second substrate SB2 are attached to each other. Therefore, the possibility that the first glue GL1 and/or the second glue GL2 for attaching the first substrate SB1 and the second substrate SB2 are damaged due to the influence of the process temperature of the wire WL may be reduced, thereby increasing the choice of the materials of the first glue GL1 and/or the second glue GL2, or the material of the wires WL may be selected from high-temperature-sintered materials to improve the flexibility of the manufacturing process of the electronic device ED.

In summary, a manufacturing method of an electronic device is provided by the present disclosure, wherein the electronic device includes a first substrate, a second substrate, a first glue and a second glue for attaching the first substrate and the second substrate, a wire disposed on the side surfaces of the first substrate and/or the second substrate, and a driving element disposed on a rear surface of the first substrate. When the electronic device of the present disclosure is applied to tiled electronic devices, the sense of seam in the tiled device may be reduced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A manufacturing method of an electronic device, comprising:
providing a first substrate, wherein the first substrate includes a circuit layer and an electronic element disposed on the circuit layer;
providing a second substrate;
bonding the first substrate and the second substrate to form an electronic module;
cutting the electronic module;
forming a wire on a first surface which is exposed after cutting the electronic module and on a second surface of the electronic module, wherein the first surface is adjacent to the second surface, and the wire is electrically connected to the circuit layer; and disposing a driving element on the second surface of the electronic module to be electrically connected to the wire.

2. The manufacturing method of the electronic device of claim 1, wherein the wire is formed on the first surface and the second surface of the electronic module through a printing process.

3. The manufacturing method of the electronic device of claim 1, wherein the first substrate and the second substrate are bonded through a first glue and a second glue surrounding the first glue.

4. The manufacturing method of the electronic device of claim 1, further comprising polishing the first surface which is exposed after cutting the electronic module.

5. The manufacturing method of the electronic device of claim 1, further comprising forming an encapsulating layer on the first surface which is exposed after cutting the electronic module.

6. The manufacturing method of the electronic device of claim 1, wherein the second substrate includes an optical structure.

7. The manufacturing method of the electronic device of claim 6, wherein the optical structure includes a color filter.

8. The manufacturing method of the electronic device of claim 7, wherein the optical structure further includes a light converting layer disposed on the color filter.

* * * * *